United States Patent [19]

Terashima

[11] Patent Number: 5,334,546
[45] Date of Patent: Aug. 2, 1994

[54] METHOD OF FORMING A SEMICONDUCTOR DEVICE WHICH PREVENTS FIELD CONCENTRATION

[75] Inventor: Tomohide Terashima, Fukuoka, Japan

[73] Assignee: Mitsubishi Denki Kabushiki Kaisha, Tokyo, Japan

[21] Appl. No.: 20,719

[22] Filed: Feb. 22, 1993

Related U.S. Application Data

[60] Division of Ser. No. 807,754, Dec. 17, 1991, Pat. No. 5,204,545, which is a continuation of Ser. No. 545,600, Jun. 29, 1990, abandoned.

[30] Foreign Application Priority Data

Nov. 22, 1989 [JP] Japan .................................. 1-305361

[51] Int. Cl.⁵ .......................................... H01L 21/265
[52] U.S. Cl. .......................................... 437/41; 437/74; 437/941
[58] Field of Search .................... 437/52, 60, 918, 919, 437/53, 41, 63, 64, 70, 941

[56] References Cited

U.S. PATENT DOCUMENTS

| | | | |
|---|---|---|---|
| 4,021,789 | 5/1977 | Furman et al. | 437/60 |
| 4,567,502 | 1/1986 | Nakagawa et al. | |
| 5,043,781 | 8/1991 | Nishiura | 437/913 |

*Primary Examiner*—Olik Chaudhuri
*Assistant Examiner*—H. Jey Tsai
*Attorney, Agent, or Firm*—Oblon, Spivak, McClelland, Maier & Neustadt

[57] ABSTRACT

There is provided p diffusion regions (18a, 18b) in the surface of an end portion of the n island (7) formed on the p⁻substrate (12). The insulation film (14) is formed on the n island (7) to form therein conductive plates (16a–16e). The p diffusion regions (18a, 18b) and, the conductive plates (16a–16e) are alternately arranged and so aligned that adjacent pairs of end portions thereof overlap with each other. Capacitances of capacitive coupling of the conductive plates (16a–16e) and the p diffusion regions (18a, 18b) are optimized so that potentials of the conductive plates (16a–16e) and the p diffusion regions (18a, 18b) can substantially linearly change from a low level to a high level. Thus, the concentration of electric field can be prevented.

3 Claims, 5 Drawing Sheets

METHOD OF FORMING A SEMICONDUCTOR DEVICE WHICH PREVENTS FIELD CONCENTRATION

This is a division of application Ser. No. 07/807,754, filed on Dec. 17, 1991, now U.S. Pat. No. 5,204,545, which is a continuation of 07/545,600, Jun. 29, 1990, now abandoned.

BACKGROUND OF THE INVENTION

1. Field of the Invention

The present invention relates to a structure for preventing field concentration caused in an end portion of a semiconductor region, which is formed by p-n junction isolation on a semiconductor substrate, provided under a conductive layer, which extends above the semiconductor region across the end portion thereof, through influence exerted by an electric field from the conductive layer, and a method of forming the same and, more particularly, it is advantageous in the case where the semiconductor region and the conductive layer are maintained at high potentials of substantially identical degrees and a high vol rage is applied between the conductive layer and the semiconductor substrate.

2. Description of the Background Art

A PWM inverter circuit is generally known as a circuit for driving a load such as a brushless motor. FIG. 1 is a schematic block diagram showing a single phase of such a PWM inverter. Power switching devices such as power MOS transistors 2 and 3 are totempole connected between a high-potential power line 1 and the ground. An output of this phase is derived from the junction between the power MOS transistors 2 and 3, and supplied to a load. Upper and lower arm driving circuits 4 and 5 receive upper and lower arm control signals from a control circuit (not shown), to convert the control signals into gate signals for turning on/off the power MOS transistors 2 and 3 of upper and lower arms, respectively, and supply the same to the power MOS transistors 2 and S.

FIG. 2 is a sectional view showing a state of insulation/isolation of the upper and lower arm driving circuits 4 and 5 formed on one chip 5. The upper arm driving circuit 4 is formed in a region 8 which is defined in an island 7, and the lower arm driving circuit 5 is formed in an island 9. Since the power MOS transistor 2 of the upper arm operates in a high-voltage region and, therefore, the upper arm driving circuit 4 for driving the power MOS transistor 2 must also operate in a high-voltage region, the potential of the region 8 provided with the upper arm driving circuit 4 is extremely increased. In order to sufficiently ensure breakdown voltage, therefore, the $n^-$-type region 8 is defined in the island 7 by enclosing it an $n^+$-type buried diffusion region 10 and an n-type diffusion region 11, to form the upper arm driving circuit 4 in this region 8. The islands 7 and 9 are formed by separating an $n^-$-type epitaxial layer which is formed on a $p^-$-type semiconductor substrate 12 by a p-type isolating diffusion region 13. Since an output/input aluminium interconnection for the region 8 must pass above an end region 7a, the region 7a is necessary to be provided with a structure for moderating an electric field from the interconnection in order to prevent the decrease of breakdown voltage due to the existence of the interconnection.

FIG. 3 is a sectional view showing a portion around the end region 7a of the high-voltage island 7 in detail. An insulating film 14 is formed on the $p^-$-type semiconductor substrate 12, and an aluminum interconnection 15 is formed on the insulating film 14. The aluminum interconnection is electrically connected with the n-type diffusion region 11, and extends toward the low-voltage island 9 above the high-voltage holding island 7 across the end region 7a of the island 7. Conductive plates 16a to 16e of polysilicon are provided in the insulating film 14 provided under the aluminum interconnection 15. The leftmost and rightmost conductive plates 16a and 16e are connected to the p-type isolating diffusion region 13 and the n-type diffusion region 11, respectively, while the intermediate conductive plates 16b to 16d are kept in electrically floating states. The conductive plates 16a to 16e are so arranged that adjacent pairs of end portions thereof overlap with each other.

The $p^-$-type semiconductor substrate 12 and the p-type isolating diffusion region 13 are at low potentials, while the island 7, which is p-n junction-isolated from the same, is at a high potential. Therefore, depletion layers bidirectionally extend from the p-n junction interface, such that the $n^-$-type region 7a, which has particularly low impurity concentration, is completely depleted. Dotted lines appearing in FIG. 3 represent equipotential lines of the depletion layers extending into the island 7 within those bidirectionally extending from the p-n junction interface.

The conductive plate 16a is fixed at the low potential of the p-type separation diffusion region 13, and the conductive plate 16e is fixed at the high potential of the n-type diffusion region 11. The floating conductive plates 16b, 16c and 16d are fixed at certain potentials by a first capacitance between the conductive plates 16a to 16e and a second capacitance between the aluminum wiring 15 and the respective conductive plates 16a to 16e. It is possible to fix the potentials of the conductive plates 16a to 16e to substantially linearly change from a low level to a high level by optimizing the first and second capacitances. Thus, it is possible to prevent concentration of electric fields caused in the end region 7a of the island 7, particularly on its surface, through influence exerted by an electric field from the high-potential aluminum interconnection 15. Consequently, the equipotential lines in the depletion layers are not concentrated toward the p-type isolating diffusion region 13 on the surface of the $n^-$-type region 7a but are distributed with appropriate spreading, as shown by the dotted lines in FIG. 3. Thus, the island 7, which is provided with the upper arm driving circuit 4 operating in a high-voltage region, is increased in breakdown voltage.

In the aforementioned conventional structure for preventing field concentration in a semiconductor device, adjacent pairs of end portions of the conductive plates 16a to 16e must overlap with each other in order to prevent influence exerted by an electric field from the high-potential aluminum interconnection 15. If the end portions do not overlap with each other, the capacitance across the conductive plates 16a to 16e is so extremely reduced that the potential of the floating conductive plate 16b or 16c, which is close to the low-potential side, is excessively increased or the electric field from the high-potential aluminum interconnection 15 directly exerts influence on the $n^-$-type region 7a. As a result, field concentration is caused on the surface of the $n^-$-type region 7a, to reduce breakdown voltage of the island 7.

End portions of each adjacent pair of conductive plates must be provided in different vertical positions so that adjacent pairs of the end portions of the conductive plates 16a to 16e can overlap with each other. Therefore, it is necessary to carry out two steps of forming polysilicon layers for such conductive plates. This also applies to a case of employing aluminum as a material for the conductive plates 16a to 16e. The capacitance across the conductive plates 16a to 16e is varied due to influence exerted by mask misalignment caused in twice patterning of the polysilicon layers. Thus, the conventional structure for preventing field concentration in a semiconductor device is inferior in stability of characteristics (i.e., increased in dispersion) due to complicated steps, and the yield thereof is reduced.

SUMMARY OF THE INVENTION

The present invention is directed to a structure for preventing field concentration in a semiconductor device comprising a first conductivity type semiconductor substrate, a second conductivity type first semiconductor region formed on the semiconductor substrate through p-n junction isolation, and a conductive layer extending above the first semiconductor region across an end portion of the first semiconductor region.

A structure for preventing field concentration according to the present invention caused in the end portion of the first semiconductor region, existing under the conductive layer, through influence exerted by an electric field from the conductive layer, comprises an insulating film formed on the end portion of the first semiconductor region between the first semiconductor region and the conductive layer, at least one conductive plate formed in the insulating film in an electrically floating state, and at least one first conductivity type second semiconductor region formed in a surface of the end portion of the first semiconductor region to be alternately arranged with the conductive plate so that end portions of the conductive plate and the second semiconductor region overlap with each other.

A method of forming a structure for preventing field concentration according to the present invention caused in the end portion of the first semiconductor region, existing under the conductive layer, through influence exerted by an electric field from the conductive layer, comprises the steps of forming a first insulating film on the end portion of the first semiconductor region, forming at least one conductive plate on the first insulating film, introducing an impurity into the first semiconductor region by using the conductive plate as a mask to form at least one first conductivity type second semiconductor region being alternately arranged with the conductive plate so that end portions of the conductive plate and the second semiconductor region overlap with each other, in a surface of the end portion of the first semiconductor region, and forming a second insulating film over the first insulating film and the conductive plate, wherein the conductive layer is formed on the second insulating film.

According to a structure for preventing field concentration in accordance with the present invention, conductive plates and a second semiconductor region, a conductive layer and the conductive plates, as well as the conductive layer and the second semiconductor region are capacitively coupled with each other. The conductive plates and the second semiconductor region are fixed at potentials which are responsive to capacitances of the said capacitive coupling, i.e., capacitances between the conductive layer, the conductive plates and the second semiconductor region. Field concentration caused in an end portion of a first semiconductor region can be prevented by optimizing these capacitances.

According to a method of forming a structure for preventing field concentration in accordance with the present invention, a second semiconductor region is formed in a self-alignment manner with masks of conductive plates. Thus, no misregistration is caused therebetween and a stable capacitance can be regularly obtained between the conductive plates and the second semiconductor region. Further, the conductive plates can be formed through a single step.

Accordingly, an object of the present invention is to provide a structure for preventing field concentration which is formed through simple manufacturing steps with stable characteristics, and a method of forming the same.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
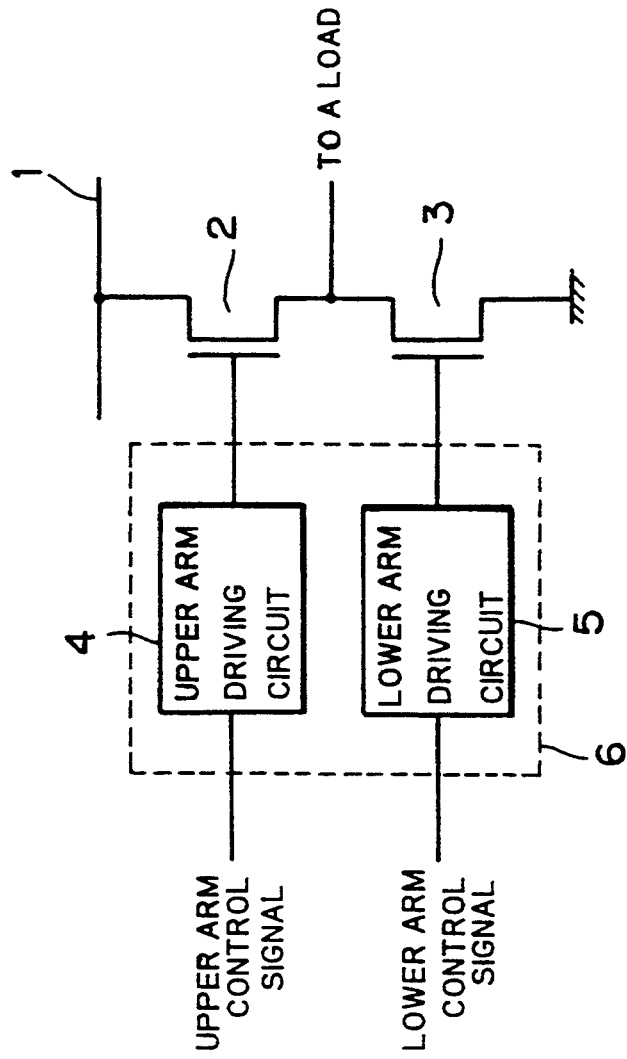
FIG. 1 is a schematic block diagram showing a single phase of a conventional PWM inverter circuit.
Figure 4:
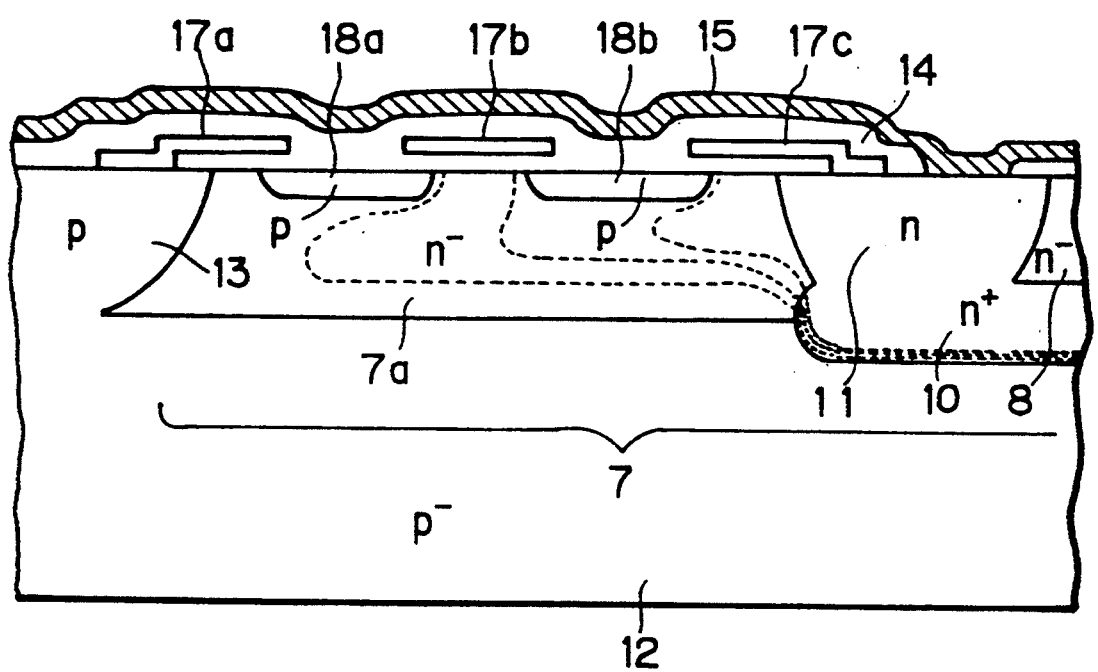
FIG. 4 is a sectional view showing an embodiment of a structure for preventing field concentration according to the present invention.

FIG. 4 is a sectional view showing a structure for preventing field concentration in a semiconductor device according to an embodiment of the present invention. A $p^-$-type semiconductor substrate 12 is provided thereon with an island 7, which is isolated by a p-type isolating diffusion region 13. This island 7 is provided therein with an $n^-$-type region 8 which is enclosed by an $n^+$-type buried diffusion region 10 and an n-type diffusion region 11, so that, for example, the upper arm driving circuit 4 of FIG. 1, which operates in a high-voltage region, is formed in the $n^-$-type region 8. A pair of p-type diffusion regions 18a and 18b are formed in the surface of an end region 7a of the island 7.

Figure 2:
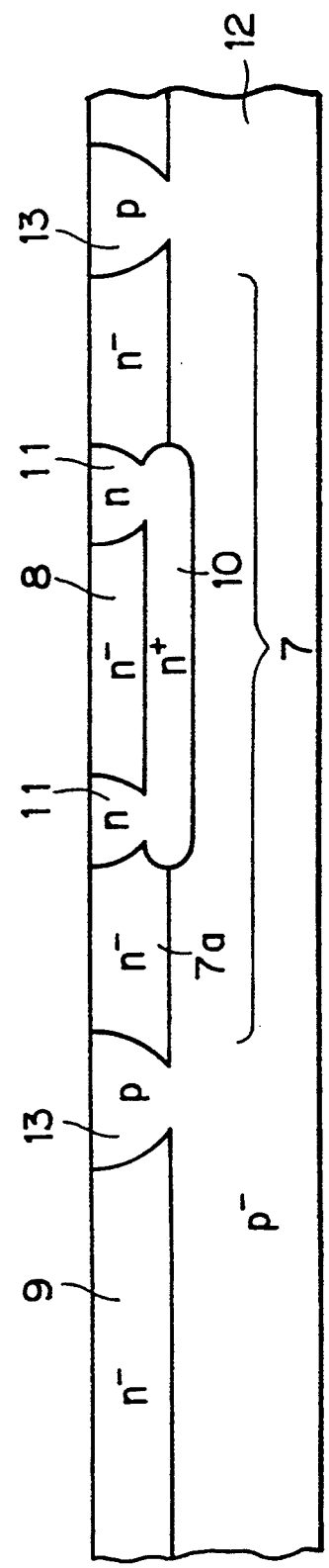
FIG. 2 is a sectional view showing a state of insulation/isolation of a high-potential island and a low-potential island.

An insulating film 14 is formed over the island and the p-type isolating diffusion region 13, and a conductive layer such as an aluminum interconnection 15 is formed on the insulating film 14. The aluminum interconnection 15 is electrically connected with the n-type diffusion region 11, and extends toward a low-voltage island (not shown), such as the island 9 shown in FIG. 2, above the high-voltage holding island 7 across the end region 7a thereof. The insulating film 14 formed under the aluminum interconnection 15 is provided therein with conductive plates 17a to 17c, which are formed of a conductive material such as polysilicon, aluminum or the like. The left and right conductive plates 17a and 17c are connected to the p-type isolating diffusion region 13 and the n-type diffusion region 11 respectively, while the intermediate conductive, plate 17b is maintained in an electrically floating state. The conductive plates 17a to 17c and the p-type diffusion regions 18a and 18b are alternately arranged and so aligned that adjacent pairs of end portions thereof overlap with each other.

The $p^-$-type semiconductor substrate 12 and the p-type isolating diffusion region 13 are at low potentials, while the island 7, which is p-n junction-isolated from the same, is at a high potential. Therefore, depletion layers bidirectionally extend from the p-n junction interface, such that the $n^-$-type region 7a having particularly low impurity concentration is completely depleted. Dotted lines appearing in FIG. 4 represent equipotential lines of depletion layers extending into the island 7 within those bidirectionally extending from the p-n junction interface.

The conductive plate 17a is fixed at the low potential of the p-type isolating diffusion region 13, and the conductive plate 17c is fixed at the high potential of the n-type diffusion region 11. Each adjacent pair of the conductive plates 17a, 17b and 17c and the p-type diffusion regions 18e and 18b, the aluminum wiring 15 and each of the conductive plates 17a, 17b and 17c, as well as the aluminum wiring 15 and each of the p-type diffusion regions 18a and 18b are capacitively coupled by capacitances existing therebetween. Thus, the floating conductive plate 17b and the p-type diffusion regions 18a and 18b, which are also in floating states, are fixed at certain potentials in response to the capacitances of such capacitive coupling.

It is possible to fix the potentials of the conductive plates 17a to 17c and the p-type diffusion regions 18a and 18b to substantially linearly change from a low level to a high level by optimizing the capacitances of the aforementioned capacitive coupling. Thus, it is possible to prevent concentration of electric fields caused in the end region 7a of the island 7, particularly on the surface thereof, through influence exerted by an electric field from the high-potential aluminum interconnection 15. Consequently, the equipotential lines in the depletion layers are not concentrated toward the p-type isolating diffusion region 13 on the surface of the $n^-$-type region 7a but are distributed with appropriate spreading as shown by the dotted lines in FIG. 4. Thus, it is possible to increase breakdown vol rage of the island 7, which is provided with the upper arm driving circuit 4 of FIG. 1 operating in a high-voltage region, for example.

Figure 5A:
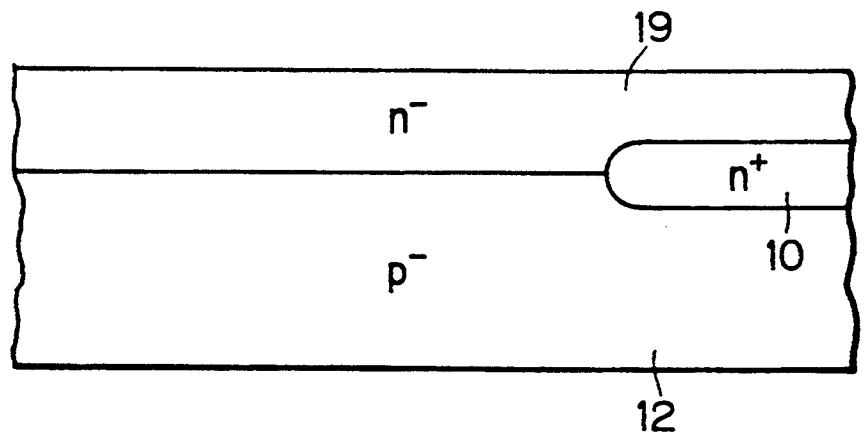
FIG. 5A to FIG. 5F are sectional views showing the procedure of forming the structure shown in FIG. 4.

FIG. 5A to FIG. 5F are sectional views showing a method of forming the structure for preventing field concentration shown in FIG. 4, As shown in FIG. 5A, an n-type impurity of high concentration is added to a prescribed region of a $p^-$-type semiconductor substrate 12 and an $n^-$-type semiconductor layer is epitaxially grown thereon to prepare an epitaxial substrate which comprises an $n^-$-type epitaxial layer 19 formed on the $p^-$-type semiconductor substrate 12 and an $n^+$-type buried diffusion layer 10 formed in a prescribed region of the p-n junction interface therebetween.

Figure 5B:
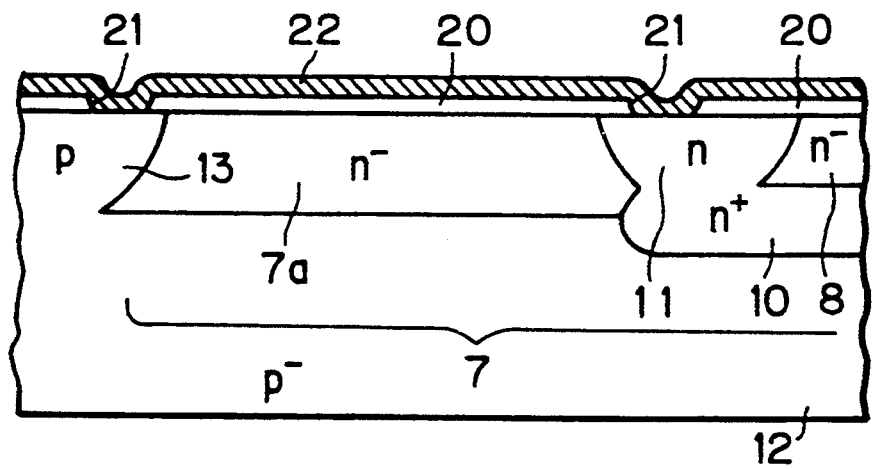

Then, as shown in FIG. 5B, a p-type isolating diffusion region 13 is formed by selectively diffusing a p-type impurity, to form an island 7. An n-type diffusion region 11 is formed in the island 7 by selectively diffusing an n-type impurity, to form an $n^-$-type region 8 which is enclosed by the $n^+$-type buried diffusion layer 10 and the n-type diffusion region 11. A silicon oxide film 20 is formed over the island 7 and the p-type isolating diffusion region 13 and patterned, thereby to form contact holes 21. Thereafter a conductive layer 22 of a conductive material such as polysilicon or aluminum is formed over the entire surface.

Figure 5C:
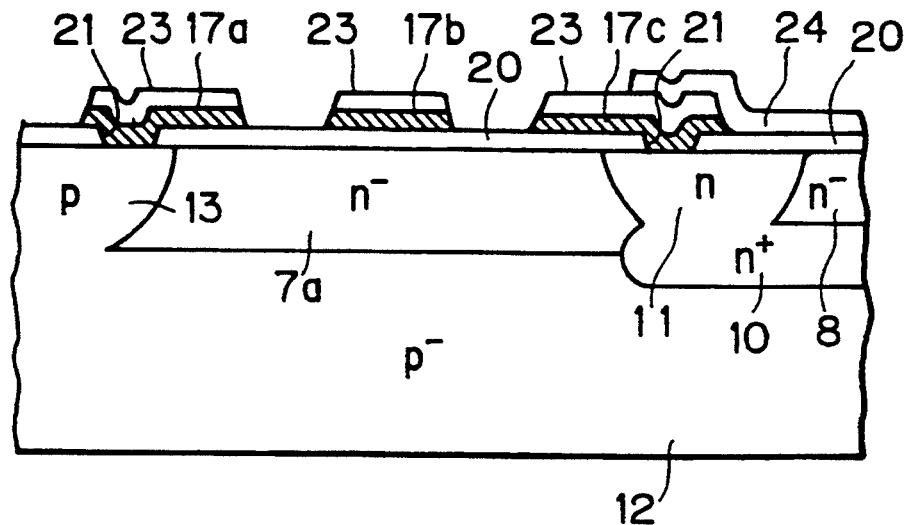

Then, as shown in FIG. 5C, resist patterns 23 are formed on the conductive layer 22 to etch the conductive layer 22 with masks of the resist patterns 23, thereby forming conductive plates 17a, 17b and 17c. The conductive plates 17a and 17c are connected with the p-type isolating diffusion region 13 and the n-type diffusion region 11, respectively, through the contact holes 21. Then, a resist pattern 24 is formed as a mask for a next step of ion implantation.

Figure 5D:
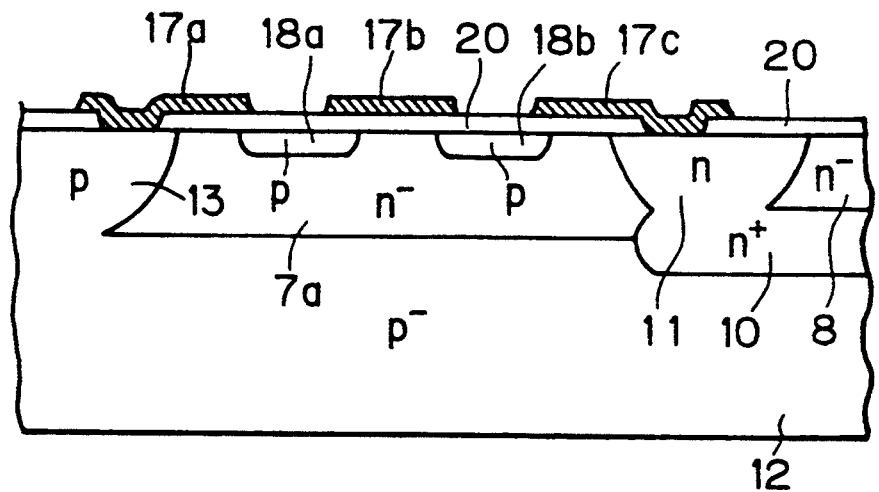

Then, the conductive plates 17a, 17b and 17c (and the resist patterns 23 formed thereon) and the resist pattern 24 are used as masks to ion-implant a p-type impurity such as boron into the $n^-$-type region 7a. The resist patterns 23 and 24 are removed and then the substance is annealed, thereby to form p-type diffusion regions 18a and 18b in the $n^-$-type region 7a, as shown in FIG. 5D.

Figure 5E:
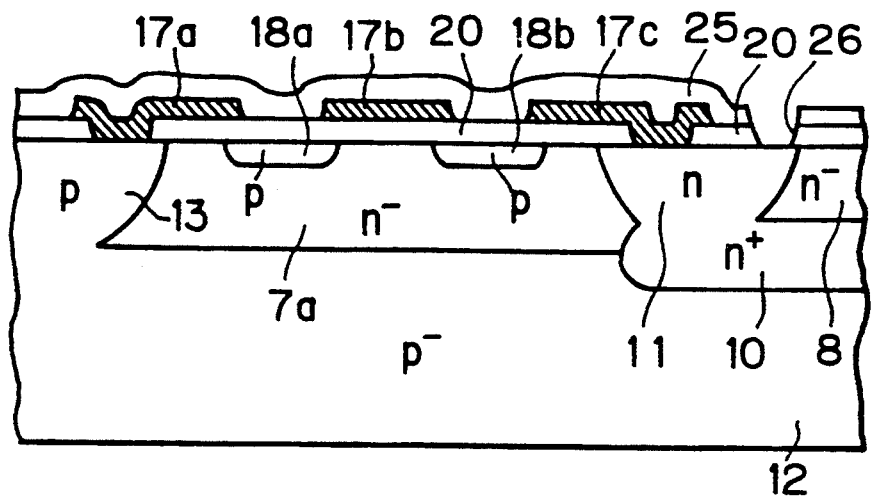
Figure 5F:
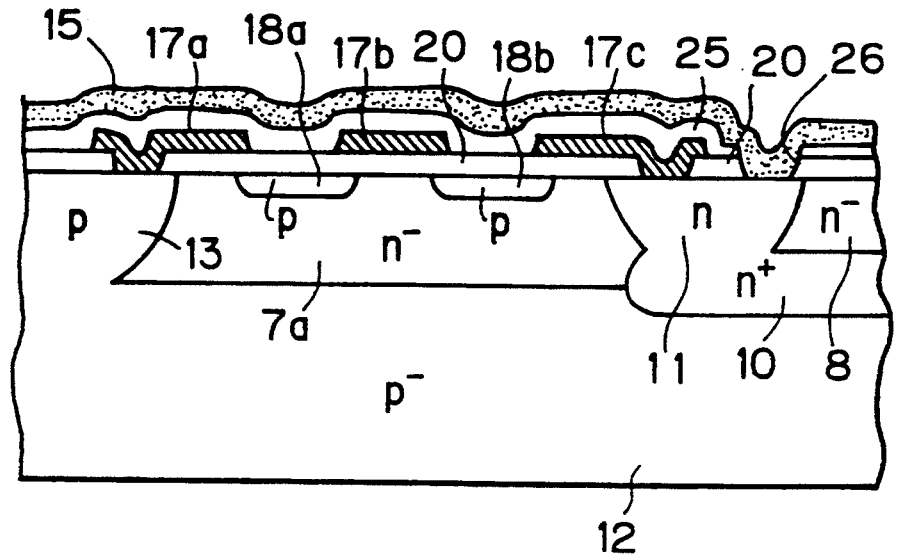

Then, as shown in FIG. 5E, a passivation oxide film 25 is formed on the overall surface, and a contact hole is defined on the n-type diffusion region 11 through photolithography. Finally, Al-Si sputtering is performed to form an aluminum interconnection 15 on the passivation oxide film 25, as shown in FIG. 5F. This aluminum interconnection 15 is insulated by an insulating film (corresponding to the insulating film 14 shown in FIG. 4), which is formed by the silicon oxide film 20 and the passivation oxide film 25, except for that the same is connected with the n-type diffusion region 11 through the contact hole 26.

According to the above embodiment, the conductive layer 22 of polysilicon or aluminum for providing the conductive plates 17a, 17b and 17c can be formed only through the single step which is shown in FIG. 5B. Since the p-type diffusion regions 18a and 1ab are formed in a self-alignment manner through masks of the conductive plates 17a, 17b and 17c, no misalignment is caused and end portions of each adjacent pair of the conductive plates 17a, 17b and 17c and the p-type diffusion regions 18a and 18b necessarily overlap with each other in response to diffusion conditions such as diffusion times. Such overlapping can be strictly controlled by the diffusion conditions. Thus, a stable capacitance can be regularly obtained between the conductive plates 17a, 17b and 17c and the p-type diffusion regions and 18b, and field concentration preventing characteristics can be stabilized with no dispersion.

Figure 6:
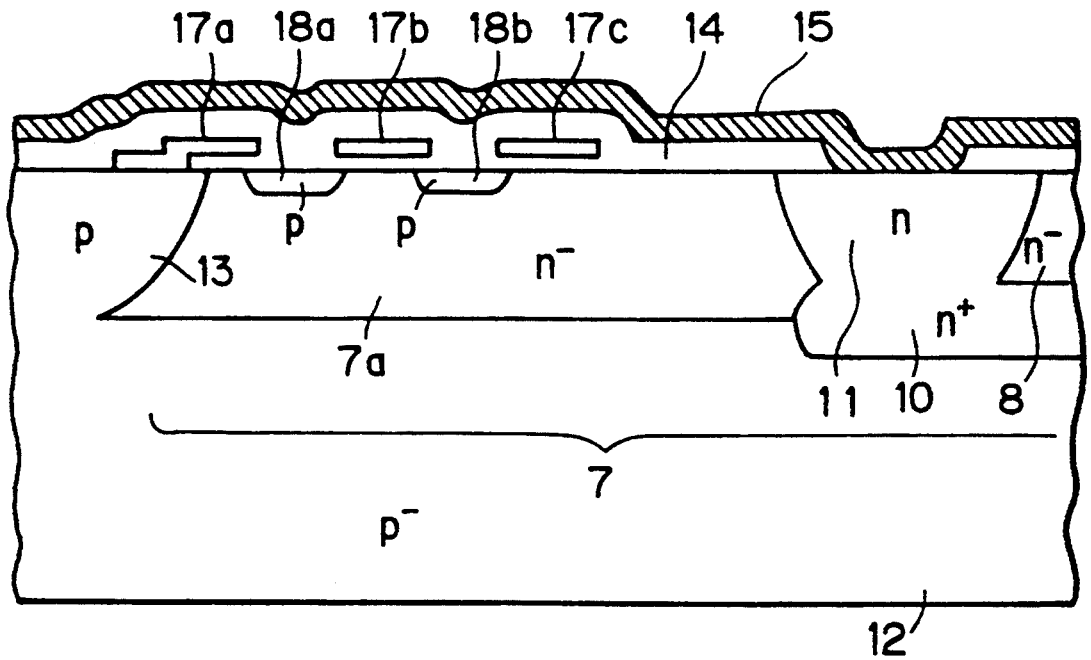
FIG. 6 is a sectional view showing another embodiment of the structure for preventing field concentration according to the present invention.
Figure 3:
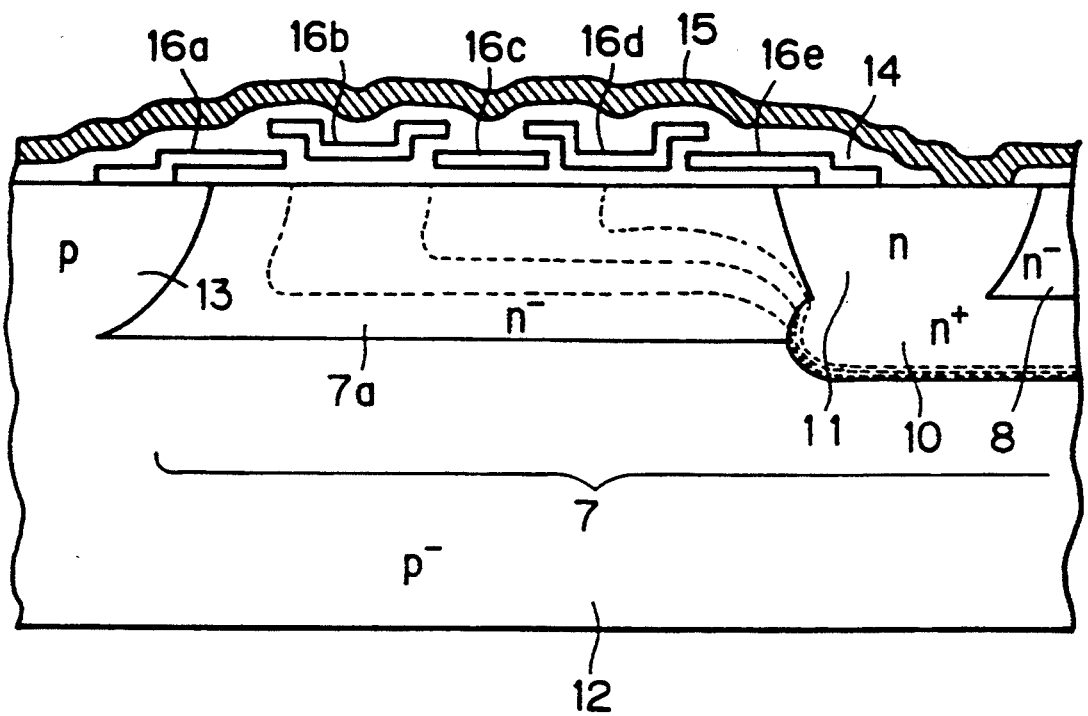
FIG. 3 is a sectional view showing a conventional structure for preventing field concentration.

FIG. 6 is a sectional view showing another embodiment of the structure for preventing field concentration in accordance with the present invention. In this embodiment, structures of capacitive coupling of conductive plates 17a, 17b and 17c and p-type diffusion regions 18a and 18b do not reach a high-potential n-type diffusion region 11, but terminate in an intermediate position of an $n^-$-type region 7a. Therefore, the rightmost conductive plate 17c is not connected to the n-type diffusion region 11, but in a floating state. Also in this embodiment, however, it is possible to fix potentials of the conductive plates 17a to 17c and the p-type diffusion regions 18a and 18b to substantially linearly change from a low level to a high level by optimizing respective capacitances of capacitive coupling, similarly to the aforementioned embodiment. Thus, it is possible to prevent concentration of electric fields in the end portion 7a of an island 7, particularly on the surface thereof, caused through influence exerted by an electric field from a high-potential aluminum interconnection 15.

If the capacitance between the leftmost conductive plate 17a end a p-type isolating diffusion region 13 can be extremely increased to attain strong capacitive coupling, the conductive plate 17a may also be brought into a floating state, similarly to the conductive plate 17c of the embodiment shown in FIG. 6.

Although the aluminum interconnection 15 is connected to the n-type diffusion region 11 of the island 7 in each of the aforementioned embodiments, the present invention is not restricted to such connection with the island 7, but is applicable to every such case that a conductive layer having a potential substantially identical to that of the island 7 extends above the island 7 across its end portion.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. In a semiconductor device comprising a first conductivity type semiconductor substrate, a second conductivity type first semiconductor region formed on said semiconductor substrate through p-n junction isolation, and a conductive layer extending above said first semiconductor region across an end portion of said first semiconductor region, a method of forming a structure for preventing field concentration caused in said end portion of said first semiconductor region, existing under said conductive layer, through influence exerted by an electric field from said conductive layer, comprising the steps of:

forming a first insulating film on said end portion of said first semiconductor region;

forming at least one conductive plate on said first insulating film;

introducing an impurity into said first semiconductor region by using said conductive plate as a mask to form at least one first conductivity type second semiconductor region being alternately arranged with said conductive plate so that end portions of said conductive plate and said second semiconductor region overlap with each other, in a surface of said end portion of said first semiconductor region; and forming a second insulating film over said first insulating film and said conductive plate, wherein said conductive layer is formed on said second insulating film.

2. A method in accordance with claim 1, wherein said first semiconductor region includes a portion of an epitaxial layer grown on said semiconductor substrate, which is isolated by a first conductivity type first diffusion region formed in said epitaxial layer to extend from a surface of said epitaxial layer to said semiconductor substrate, said step of forming at least one conductive plate including the step of forming a plurality of conductive plates one end plate of which is electrically connected with said first diffusion region.

3. A method in accordance with claim 2, wherein said semiconductor device further comprises a second conductivity type buried layer of an impurity concentration larger than that of said first semiconductor region, formed in a center of a boundary between said semiconductor substrate and said first semiconductor region, and a second conductivity type second diffusion region of an impurity concentration larger than that of said first semiconductor region formed in said first semiconductor region, which extends from a surface of said first semiconductor region to said buried layer and surround a portion of said first semiconductor region on said buried layer, another end plate of said conductive plates being electrically connected with said second diffusion region.

* * * * *